United States Patent
Lutz et al.

(10) Patent No.: US 7,410,732 B2
(45) Date of Patent: Aug. 12, 2008

(54) PROCESS FOR PRODUCING A MASK

(75) Inventors: Tarek Lutz, München (DE); Jens Schneider, München (DE)

(73) Assignee: Infineon Technologies AG, Munich (DE)

(*) Notice: Subject to any disclaimer, the term of this patent is extended or adjusted under 35 U.S.C. 154(b) by 724 days.

(21) Appl. No.: 11/059,637

(22) Filed: Feb. 16, 2005

(65) Prior Publication Data

US 2005/0214656 A1    Sep. 29, 2005

(30) Foreign Application Priority Data

Feb. 16, 2004    (DE) .................... 10 2004 007 678

(51) Int. Cl.
*G03F 1/00*    (2006.01)
(52) U.S. Cl. .......................................................... 430/5
(58) Field of Classification Search .............. 430/5, 430/394; 716/19, 20, 21
See application file for complete search history.

(56) References Cited

U.S. PATENT DOCUMENTS

| | | | |
|---|---|---|---|
| 5,366,847 A | 11/1994 | Powers | |
| 6,281,049 B1 | 8/2001 | Lee | |
| 6,968,530 B2 * | 11/2005 | Schepp et al. | 716/19 |

\* cited by examiner

*Primary Examiner*—Stephen Rosasco
(74) *Attorney, Agent, or Firm*—Slater & Matsil, L.L.P.

(57) ABSTRACT

In a process for producing a mask, layout data is provided for a semiconductor layout. The layout data is fractionated to create control data for a pattern generator. Slivers are identified slivers from the fractionating step. Second control data can be created from an enlarged imaging of the slivers. A first exposure can then be carried out using the control data and a second exposure can be carried out using the second data. The second exposure is carried out with a lower exposure dose as compared to the first exposure.

19 Claims, 2 Drawing Sheets

PROCESS FOR PRODUCING A MASK

This application claims priority to German Patent Application 10 2004 007 678.2, which was filed Feb. 16, 2004, and is incorporated herein by reference.

TECHNICAL FIELD

The invention relates to a process for producing a mask, and, in one example, includes a semiconductor layout that is fractionated in the form of control data for a pattern generator and then transferred to the pattern generator, which carries out a first exposure.

BACKGROUND

During the production and development of masks for producing semiconductor components, CAD systems are employed. These systems are capable of calculating individual exposure planes which can be transferred to a pattern generator for the purpose of mask production, from a semiconductor layout present in terms of data.

Then, with the aid of an electron beam, the pattern generator exposes the given structures onto a mask. One problem in this case is, however, that, because of its resolution, the pattern generator can expose only predefined structures, preferably rectangular structures, in a specific surface extent. For this reason, before the exposure, the mask layout has to be fractionated into individual rectangles, before it can be transferred to the pattern generator in the form of control data.

In this case, it proves to be a problem that, as a result of the rectangular conversion of complex geometric forms into rectangles, rectangles are also necessarily produced whose surfaces are so small that they cannot be processed by the pattern generator. These are called slivers.

According to the prior art, the slivers are ignored during the exposure of the mask. However, this procedure has an extremely detrimental effect on the critical structure size and, under certain circumstances, prevents the processing of particularly small or dimensionally stable structures. Furthermore, the unexposed slivers reduce the structure quality of the mask and can thus also have a detrimental effect on the quality of the end product.

SUMMARY OF THE INVENTION

In one aspect, the invention specifies a process with which problems arising as a result of the slivers are eliminated and a fault-free production process is made possible.

According to the preferred embodiment of the invention, the problem is achieved in that, following the fractionation of the mask layout, the slivers are localized and enlarged by data-handling means.

After the first exposure, the enlarged slivers are transferred to the pattern generator in the form of control data and a second exposure is carried out with a low, concentrated radiation dose.

In this case, use is made of the phenomenon that the size of a structure produced by the irradiation depends on the exposure dose. In this way, the result of the exposure of a small area with a large dose is equal to the result of a large area with a small dose.

By means of the enlarged structure and the lower dose, even a small structure like the slivers can thus be implemented. It is therefore ensured that the mask is exposed uniformly and in accordance with the layout and meets the requirements of the further production process.

In a beneficial refinement, provision is made for a critical sliver width ($a_1$) to be converted into an enlarged sliver width ($a_2$) in the second control data with an enlargement factor (n) according to $a_2 = n \cdot a_1$. Here, the exposure dose ($D_2$) in the second exposure step is carried out reduced by an attenuation factor (d) with $D_2 = d \cdot D_1$ with respect to the exposure dose ($D_1$) in the first exposure step, where $d = f(n)$.

In this case, the function $f(n)$ is selected depending on the type and reaction capability of the lacquer. Nonlinear functions can also be used here.

In a beneficial variant of the process, provision is made for the attenuation factor $d = f(n)$ to be calculated from a linear function $$d = \frac{1}{x \cdot n},$$

where $1 < x \leq 2$. A linear function of this type ch the requirements of most lacquers in a straightforward manner.

$$\frac{1}{2} \leq n \leq 10$$

has proven to be a preferred order of magnitude of the enlargement factor.

In particular, it is beneficial here for the enlargement factor to be $$\frac{2}{3} \leq n \leq 3.$$

BRIEF DESCRIPTION OF THE DRAWINGS

The invention is to be explained in more detail in the following text by using an exemplary embodiment. In the associated drawings.

Figure 1:
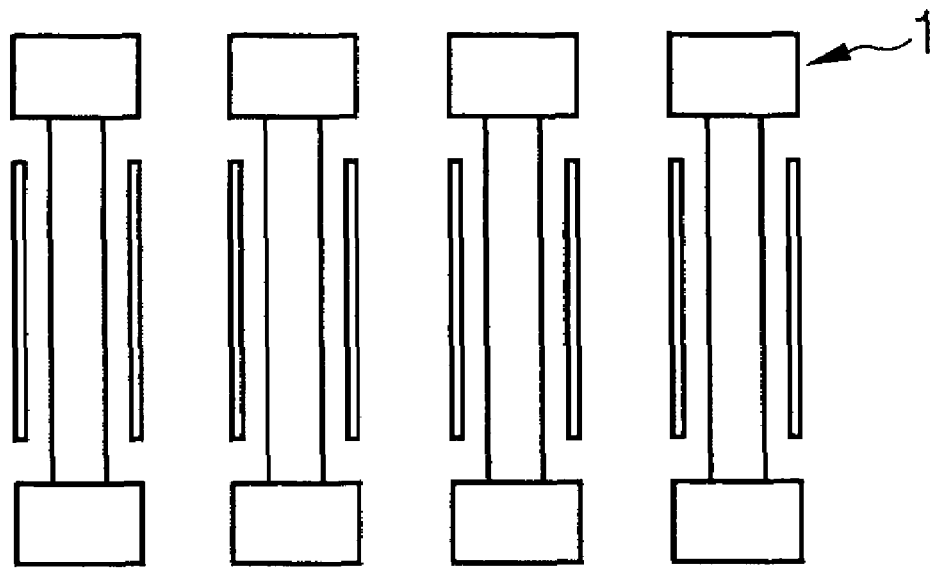
FIG. 1 shows the mask layout before the fractionation.

The following list of reference symbols can be used in conjunction with the figures
1 Pattern layout
2 Pattern layout in individual rectangles following fractionation
3 Slivers
4 Isolated slivers
5 Enlarged slivers

DETAILED DESCRIPTION OF ILLUSTRATIVE EMBODIMENTS

Figure 2:
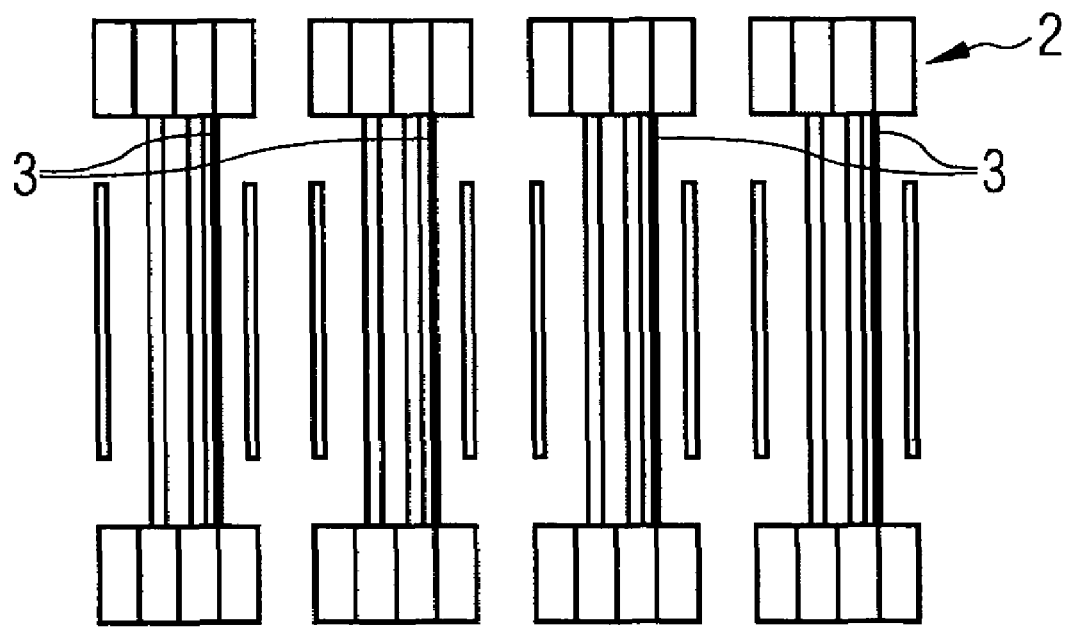
FIG. 2 shows the mask layout after the fractionation.

FIG. 1 reveals a pattern layout 1 as supplied by a CAD system. Following fractionation, the result is an accumulation of rectangles 2, as illustrated in FIG. 2, which are transferred to a pattern generator as control data. In this case it is also possible to see the slivers 3 which have a critical sliver width $a_1$, since this width $a_1$ is outside the resolution of the pattern generator.

The control data of the rectangles 2 illustrated in FIG. 2 are transferred to the pattern generator, which exposes the structures onto a mask (in a manner not specifically illustrated) by means of an electron beam with a dose $D_1$.

Figure 3:
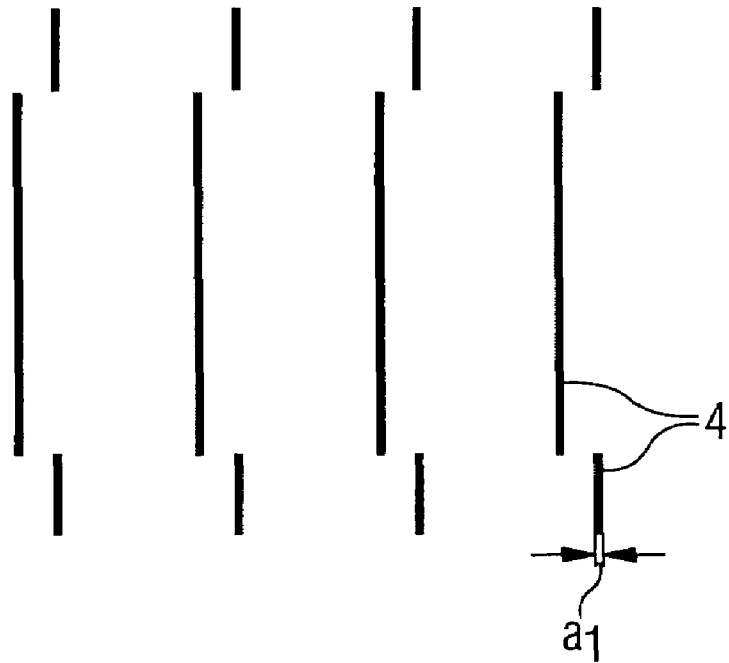
FIG. 3 shows the localized slivers.
Figure 4:
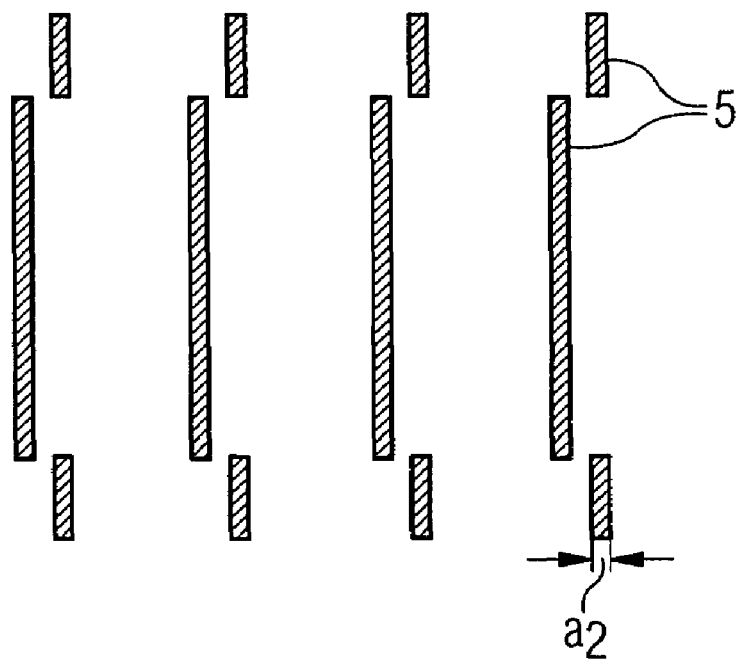
FIG. 4 shows the enlarged sliver structures.

From the control data of the individual rectangles 2 illustrated in FIG. 2, the slivers 4 are then isolated in accordance with FIG. 3 and subsequently enlarged by the enlargement factor n, as illustrated in FIG. 4. These enlarged slivers 5 then have a sliver width $a_2$ which can be resolved by the pattern generator. For example, the sliver width $a_2$ is twice as large as the sliver width $a_1$ in the first exposure step, in which the slivers cannot be represented because of the excessively coarse resolution, that is to say n=2.

The control data of the slivers 5 that have now been enlarged are used for a renewed exposure with the pattern generator, but which in this case takes place with a dose $D_2$ that is lower by the attenuation factor d, in this case with half the dose, since the function $$d = \frac{1}{n}$$

is sufficient in the lacquer used. Therefore, the enlarged slivers 5 are reproduced in the mask in the original size with the sliver width $a_1$, so that the structural width as has been calculated by the CAD system can also actually be produced.

What is claimed is:

1. A process for producing a mask, the process comprising:
   providing layout data for a semiconductor layout;
   fractionating the layout data to create control data for a pattern generator;
   identifying slivers derived during the fractionating step;
   calculating second control data from an enlarged imaging of the slivers;
   carrying out a first exposure using the control data; and
   carrying out a second exposure using the second data, the second exposure being carried out with a lower exposure dose as compared to the first exposure.

2. The process according to claim 1, and further comprising transferring the control data and the second control data to the pattern generator, wherein the first exposure and the second exposure are carried out by the pattern generator.

3. The process according to claim 2, wherein the first exposure and the second exposure are carried out using an electron beam.

4. The process according to claim 1, wherein a critical sliver width $a_1$ is converted into an enlarged sliver width $a_2$ in the second control data with an enlargement factor n according to $a_2 = n \cdot a_1$ and an exposure dose $D_2$ in the second exposure step is carried out reduced by an attenuation factor d where $D_2 = d \cdot D_1$ with respect to an exposure dose $D_1$ in the first exposure step, where $d = f(n)$.

5. The process according to claim 4, wherein the attenuation factor $d = f(n)$ is calculated from a linear function $$d = \frac{1}{x \cdot n},$$

where $1 \leq x \leq 2$.

6. The process according to claim 5, wherein the enlargement factor is $$\frac{1}{2} \leq n \leq 10.$$

7. The process according to claim 6, wherein the enlargement factor is $$\frac{2}{3} \leq n \leq 3.$$

8. The process according to claim 4, wherein the enlargement factor is $$\frac{1}{2} \leq n \leq 10.$$

9. The process according to claim 8, wherein the enlargement factor is $$\frac{2}{3} \leq n \leq 3.$$

10. A process for manufacturing a semiconductor device, the process comprising:
    providing layout data for a semiconductor layout;
    fractionating the layout data to create first control data, the first control data representing shapes greater than a minimum size;
    identifying slivers derived during the fractionating step, the slivers being shapes smaller than the minimum size;
    calculating second control data by enlarged images of the slivers;
    forming a pattern on a mask by carrying out a first exposure using the first control data and carrying out a second exposure using the second control data, the second exposure being carried out with a lower exposure dose as compared to the first exposure; and
    producing a semiconductor component using the mask.

11. The process according to claim 10, and further comprising transferring the control data and the second control data to the pattern generator, wherein the first exposure and the second exposure are carried out by the pattern generator.

12. The process according to claim 11, wherein the first exposure and the second exposure are carried out using an electron beam.

13. The process according to claim 10, wherein a critical sliver width $a_1$ is converted into an enlarged sliver width $a_2$ in the second control data with an enlargement factor n according to $a_2 = n \cdot a_1$ and an exposure dose $D_2$ in the second exposure step is carried out reduced by an attenuation factor d where $D_2 = d \cdot D_1$ with respect to an exposure dose $D_1$ in the first exposure step, where $d = f(n)$.

14. The process according to claim 13, wherein the attenuation factor $d = f(n)$ is calculated from a linear function $$d = \frac{1}{x \cdot n},$$

where $1 \leq x \leq 2$.

15. The process according to claim 14, wherein the enlargement factor is $$\frac{1}{2} \leq n \leq 10.$$

16. The process according to claim 15, wherein the enlargement factor is $$\frac{2}{3} \leq n \leq 3.$$

17. The process according to claim 13, wherein the enlargement factor is $$\frac{1}{2} \leq n \leq 10.$$

18. The process according to claim 17, wherein the enlargement factor is $$\frac{2}{3} \leq n \leq 3.$$

19. The process according to claim 10, wherein the layout data represents one exposure plane of the semiconductor component.

* * * * *